United States Patent
Sugamori (12)

(10) Patent No.: US 6,536,006 B1
(45) Date of Patent: Mar. 18, 2003

(54) EVENT TESTER ARCHITECTURE FOR MIXED SIGNAL TESTING

(75) Inventor: Shigeru Sugamori, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/439,865

(22) Filed: Nov. 12, 1999

(51) Int. Cl.[7] ............................................. G01R 31/28
(52) U.S. Cl. ..................................................... 714/724
(58) Field of Search ................................. 714/724, 733, 714/734, 31, 56, 43, 712; 324/158.1

(56) References Cited

U.S. PATENT DOCUMENTS 5,216,361 A * 6/1993 Akar et al. ................. 324/761
5,646,521 A * 7/1997 Rosenthal et al. ....... 324/158.1
6,057,679 A * 5/2000 Slizynski et al. ......... 324/158.1
6,331,770 B1 * 12/2001 Sugamori ................. 324/158.1

* cited by examiner

Primary Examiner—Christine T. Tu
(74) Attorney, Agent, or Firm—Muramatsu & Associates

(57) ABSTRACT

A semiconductor test system having a plurality of different types of tester modules for testing a mixed signal integrated circuit (IC) having analog signals and digital signals with high speed and high efficiency. The semiconductor test system includes two or more tester modules whose performances are different from one another, a test head to accommodate the two or more tester modules, means provided on the test head for electrically connecting the tester modules and a device under test, an optional circuit corresponding to the device under test when the device under test is a mixed signal IC, and a host computer for controlling an overall operation of the test system. Each event tester module includes a tester board which is configured as an event based tester.

11 Claims, 9 Drawing Sheets

Fig. 8
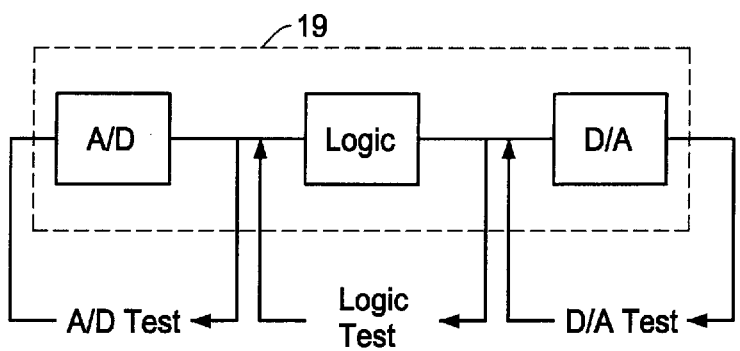
Fig. 9A
Fig. 9B
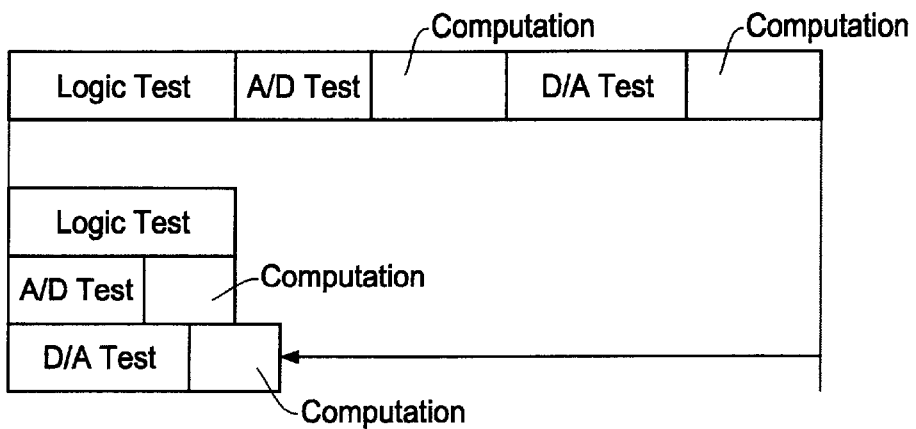

EVENT TESTER ARCHITECTURE FOR MIXED SIGNAL TESTING

FIELD OF THE INVENTION

This invention relates to a semiconductor test system for testing semiconductor integrated circuits such as a large scale integrated (LSI) circuit, and more particularly, to a semiconductor test system having an event tester architecture which is capable of testing a mixed signal integrated circuit with high speed and high efficiency. In the semiconductor test system of the present invention, a test system is formed by freely combining a plurality of tester modules having identical or different capabilities where each of the tester module operates independently from one another thereby being able to test an analog signal block and a digital signal block of the device under test at the same time.

BACKGROUND OF THE INVENTION

FIG. 1 is a schematic block diagram showing an example of a semiconductor test system in the conventional technology for testing a semiconductor integrated circuit (hereafter may also be referred to as "IC device", "LSI under test" or "device under test").

In the example of FIG. 1, a test processor 11 is a dedicated processor provided within the semiconductor test system for controlling the operation of the test system through a tester bus. Based on pattern data from the test processor 11, a pattern generator 12 provides timing data and waveform data to a timing generator 13 and a wave formatter 14, respectively. A test pattern is produced by the wave formatter 14 with use of the waveform data from the pattern generator 12 and the timing data from the timing generator 13, and the test pattern is supplied to a device under test (DUT) 19 through a driver 15.

A response signal from the DUT 19 resulted from the test pattern is converted to a logic signal by an analog comparator 16 with reference to a predetermined threshold voltage level. The logic signal is compared with expected value data from the pattern generator 12 by a logic comparator 17. The result of the logic comparison is stored in a failure memory 18 corresponding to the address of the DUT 19. The driver 15, the analog comparator 16 and switches (not shown) for changing pins of the device under test, are provided in a pin electronics 20.

The circuit configuration noted above is provided to each test pin of the semiconductor test system. Therefore, since a large scale semiconductor test system has a large number of test pins, such as from 256 test pins to 1024 test pins, and the same number of circuit configurations each being shown in FIG. 1 are incorporated, an actual semiconductor test system becomes a very large system. FIG. 2 shows an example of outer appearance of such a semiconductor test system. The semiconductor test system is basically formed with a main frame 22, a test head 24, and a work station 26.

The work station 26 is a computer provided with, for example, a graphic user interface (GUI) to function as an interface between the test system and a user. Operations of the test system, creation of test programs, and execution of the test programs are conducted through the work station 26.

The main frame 22 includes a large number of test pins (test channels) each having the test processor 11, pattern generator 12, timing generator 13, wave formatter 14 and comparator 17 shown in FIG. 1.

The test head 24 includes a large number of printed circuit boards each having the pin electronics 20 shown in FIG. 1. The test head 24 has, for example, a cylindrical shape in which the printed circuit boards forming the pin electronics are radially aligned. On an upper surface of the test head 24, a device under test 19 is inserted in a test socket at about the center of a performance board 28.

Between the pin electronics circuit and the performance board 28, a pin (test) fixture 27 is provided which is a contact mechanism for communication of electrical signals. The pin fixture 27 includes a large number of contactors such as pogo-pins for electrically connecting the pin electronics circuits and the performance board. The device under test 19 receives a test pattern signal from the pin electronics and produces a response output signal.

In the conventional semiconductor test system, for producing a, test pattern to be applied to a device under test, the test data which is described by, what is called a cycle based format, has been used. In the cycle based format, each variable in the test pattern is defined relative to each test cycle (tester rate) of the semiconductor test system. More specifically, test cycle (tester rate) descriptions, waveform (kinds of waveform, edge timings) descriptions, and vector descriptions in the test data specify the test pattern in a particular test cycle.

In the design stage of the device under test, under a computer aided design (CAD) environment, the resultant design data is evaluated by performing a logic simulation process through a testbench. However, the design evaluation data thus obtained through the testbench is described in an event based format. In the event based format, each change point (event) in the particular test pattern, such as from "0" to "1" or from "1" to "0", is described with reference to a time passage. The time passage is expressed by, for example, an absolute time length from a predetermined reference point or a relative time length between two adjacent events.

The inventor of this invention has disclosed the comparison between the test pattern formation using the test data in the cycle based format and the test pattern formation using the test data in the event based format in the U.S. patent application Ser. No. 09/340,371. The inventor of this invention has also proposed an event based test system as a semiconductor test system as a new concept test system. The details of the structure and operation of the event based test system is given in the U.S. patent application Ser. No. 09/406,300 owned by the same assignee of this invention.

As described in the foregoing, in the semiconductor test system, a large number of printed circuit boards and the like which is equal to or greater than the number of the test pins are provided, resulting in a very large system as a whole. In the conventional semiconductor test system, the printed circuit boards and the like are identical to one another.

For example, in a high speed and high resolution test system, such as a test rate of 500 MHz and timing accuracy of 80 picosecond, the printed circuit boards for all the test pins have the same capabilities each being able to satisfy the test rate and timing accuracy. Thus, the conventional semiconductor test system inevitably becomes a very high cost system. Further, since the identical circuit structure is used in each test pin, the test system can conduct only limited types of test.

An example of devices to be tested includes a type of semiconductor device which has both an analog function and a digital function. A typical example of which is an audio IC or a communication device IC which includes an analog-digital (AD) converter, a digital-analog (DA) converter and a digital signal processing circuit. In the conventional semiconductor test system, only one type of functional test must be conducted at one time. Therefore, to test the mixed signal integrated circuit noted above, each functional block must be tested separately in a series fashion, such as, first testing the AD converter, then testing the DA converter, and after that, testing the digital signal processing circuit.

Even in the case where testing a device which is configured solely by logic circuits, almost always, not all of the pins of such a device under test require the highest performance of the semiconductor test system. For example, in a typical logic LSI device to be tested having several hundred pins, only several pins actually operate at the highest speed and require the highest speed test signal while other several hundred pins operate at substantially lower speed and require low speed test signals. This is also true to a system-on-chip (SoC), a recent semiconductor device which draws high attention. Thus, high speed test signals must be applied to only a small number of pins of SoC while low speed test signals are sufficient for other pins.

Since the conventional semiconductor test system cannot conduct different types of test in parallel at the same time, it has a drawback that, to complete the mixed signal device test, it requires a long time. Further, the high performance which is needed only for a small number of pins of the device under test is equipped to all of the test pins, resulting in the high cost of the test system.

One of the reasons that the conventional semiconductor test system installs the identical circuit configuration in all of the test pins as noted above, and as a result, are not able to conduct two or more different kinds of test at the same time by having different circuit configuration, is that the test system is configured to generate the test pattern by using the cycle based test data. In producing the test pattern using the cycle based concept, the software and hardware tend to be complicated even when using the same circuit configuration for all the test channels. Thus, it is practically impossible to include different circuit configurations in the test system because it would make the test system and associated software even more complicated.

To explain the above noted reason more clearly, brief comparison is made between the test pattern formation using the test data in the cycle based format and the test pattern formation using the test data in the event based format with reference to waveforms shown in FIG. 3. The more detailed comparison is disclosed in the above noted U.S. patent applications owned by the same assignee of this invention.

The example of FIG. 3 shows the case where a test pattern is created based on the data resulted from the logic simulation conducted in the design stage of the integrated circuit and stored in a dump file (VCD) 37. The output of the dump file is data in the event based format showing the changes in the input and output of the designed LSI (large scale integrated circuit) device and having descriptions 38 shown in the lower right of FIG. 3 for expressing, for example, the waveforms 31.

In this example, it is assumed that test patterns such as shown by the waveform 31 are to be formed by using such descriptions. The waveforms 31 illustrate test patterns to be generated by pins (tester pins or test channels) Sa and Sb, respectively. The event data describing the waveforms is formed of set edges San, Sbn and their timings (for example, time lengths from a reference point), and reset edges Ran, Rbn and their timings.

For producing a test pattern to be used in the conventional semiconductor test system based on the cycle based concept, the test data must be divided into test cycles (tester rate), waveforms (types of waveforms, and their edge timings), and vectors. An example of such descriptions is shown in the center and left of FIG. 3. In the cycle based test pattern, as shown by waveforms 33 in the left part of FIG. 3, a test pattern is divided into each test cycle (TS1, TS2 and TS3) to define the waveforms and timings (delay time) for each test cycle.

An example of data descriptions for such waveforms, timings and test cycles is shown in timing data (test plan) 36. An example of logic "1", "0" or "Z" of the waveforms is shown in vector data (pattern data) 35. For example, in the timing data 36, the test cycle is described by "rate" to define time intervals between test cycles, and the waveform is described by RZ (return to zero), NRZ (non-return to zero) and XOR (exclusive OR). Further, the timing of each waveform is defined by a delay time from a predetermined edge of the corresponding test cycle.

As in the foregoing, because the conventional semiconductor test system produces a test pattern under the cycle based procedure, the hardware structures in the pattern generator, timing generator, and wave formatter tend to be complicated, and accordingly, the software to be used in such hardware also becomes complicated as well. Further, since all of the test pins (such as Sa and Sb in the above example) are defined by the common test cycle, it is not possible to generate test patterns of different cycles among the test pins at the same time.

Therefore, in the conventional semiconductor test system, the same circuit configurations are used in all of the test pins, and it is not possible to incorporate printed circuit boards of different circuit structures therein. As a consequence, it is not possible to perform different test such as the analog block test and the digital block test at the same time in a parallel fashion. Moreover, for example, a high speed type test system also needs to include a low speed hardware configuration (such as high voltage and large amplitude generation circuit and a driver inhibit circuit, etc.), the high speed performance cannot be fully improved in such a test system.

In contrast, for producing a test pattern by using the event based method, it is only necessary to read set/reset data and associated timing data stored in an event memory, requiring very simple hardware and software structures. Further, each test pin can operate independently as to whether there is any event therein rather than the test cycle, thus, test patterns of different functions and frequency ranges can be generated at the same time.

As noted in the foregoing, the inventors of this invention have proposed the event based semiconductor test system. In the event based test system, since the hardware and software involved are very simple in the structure and contents, it is possible to formulate an overall test system having different hardware and software therein. Moreover, since each test pin can operate independently from the other, two or more tests which are different in functions and frequency ranges from one another can be carried out in a parallel fashion at the same time.

SUMMARY OF THE INVENTION

Therefore, it is an object of the present invention to provide a semiconductor test system which has tester modules of different capabilities corresponding to test pins and thus is capable of testing a mixed signal device under test by testing the analog function and the digital function in parallel at the same time.

It is another object of the present invention to provide a semiconductor test system in which tester modules of different pin numbers and capabilities can freely installed in a tester main frame (or test head) and in which specification for connection between the tester modules and the tester main frame is standardized.

It is a further object of the present invention to provide a semiconductor test system which can freely accommodate a plurality of tester modules of different capabilities, thereby testing a plurality of different kinds of devices or functional blocks under test in parallel at the same time.

It is a further object of the present invention to provide a semiconductor test system which can freely accommodate a plurality of tester modules of different capabilities, thereby establishing a test system having a sufficient test performance with low cost, and further enabling to improve its capability in the future.

The semiconductor test system of the present invention includes two or more tester modules whose performances are different from one another, a test head to accommodate the two or more tester modules having different performances, means provided on the test head for electrically connecting the tester modules and a device under test, an optional circuit corresponding to the device under test when the device under test is a mixed signal IC having analog and digital functions, and a host computer for controlling an overall operation of the test system by communicating with the tester modules through a tester bus. One type of the performances of the tester module is a high speed and high timing resolution while other type of performance is a low speed and low timing resolution.

In the semiconductor test system of the present invention, each of the tester modules includes a plurality of event tester boards. Under the control of the host computer, each tester board provides a test pattern to a corresponding pin of the device under test and evaluates a resultant output signal from the device under test.

Since the semiconductor test system of the present invention has a modular structure, a desired test system can be formed freely depending on the kind of devices to be tested and the purpose of the test. Thus, when the device under test is a mixed signal integrated circuit (having both an analog circuit and a digital circuit therein), the analog circuit and the digital circuit can be tested in parallel at the same time. When the device under test is a high speed logic IC, only a small portion of the logic circuits therein are actually operating in the high speed. Thus, for testing such a high speed logic IC, a small number of tester pins have to have high speed capability. In the semiconductor test system of the present invention, the specification for connecting the test head and tester modules (interface) is standardized. Accordingly, any tester modules having the standard interface can be installed at any positions in the test head.

As noted above, in the semiconductor test system of the present invention, the tester module (tester board) is configured by event based architecture where all the information required for executing the test is prepared in the event based format. Therefore, the rate signal showing the start timing of each test cycle or the pattern generator which operates in synchronism with the rate signal used in the conventional technology are no longer necessary. Because it is not necessary to include the rate signal or pattern generator, each test pin in the event based test system can operate independently from the other test pins. Therefore, different types of test, such as analog circuit test and digital circuit test can be performed at the same time.

Further, because of the event based architecture, the hardware of the event based test system can be dramatically reduced while the software for controlling the tester modules can be dramatically simplified. Accordingly, an overall physical size of the event based test system can be reduced, resulting in further cost reduction, floor space reduction and associated cost savings.

Further in the semiconductor test system of the present invention, the logic simulation data in the design stage of the device in the electronic design automation (EDA) environment can be directly used to produce the test pattern to test the device in the evaluation stage. Thus, a turnaround time between the design of the device and the evaluation of the device can be substantially decreased, thereby further decreasing the test cost while increasing the test efficiency.

BRIEF DESCRIPTION IF THE DRAWINGS

FIG. 8 is a schematic diagram showing an internal structure of a mixed signal IC which is mixed with an analog function and a digital function, and a concept of testing such different functions in the mixed signal device under test in a parallel fashion by the semiconductor test system of the present invention.

FIG. 9A is a schematic diagram showing a test process for testing the mixed signal device by the conventional semiconductor test system and FIG. 9B is a schematic diagram showing a test process for testing the mixed signal device by the semiconductor test system of the present invention.

DETAILED DESCRIPTION OF THE PREFERRED EMBODIMENT

Figure 1:
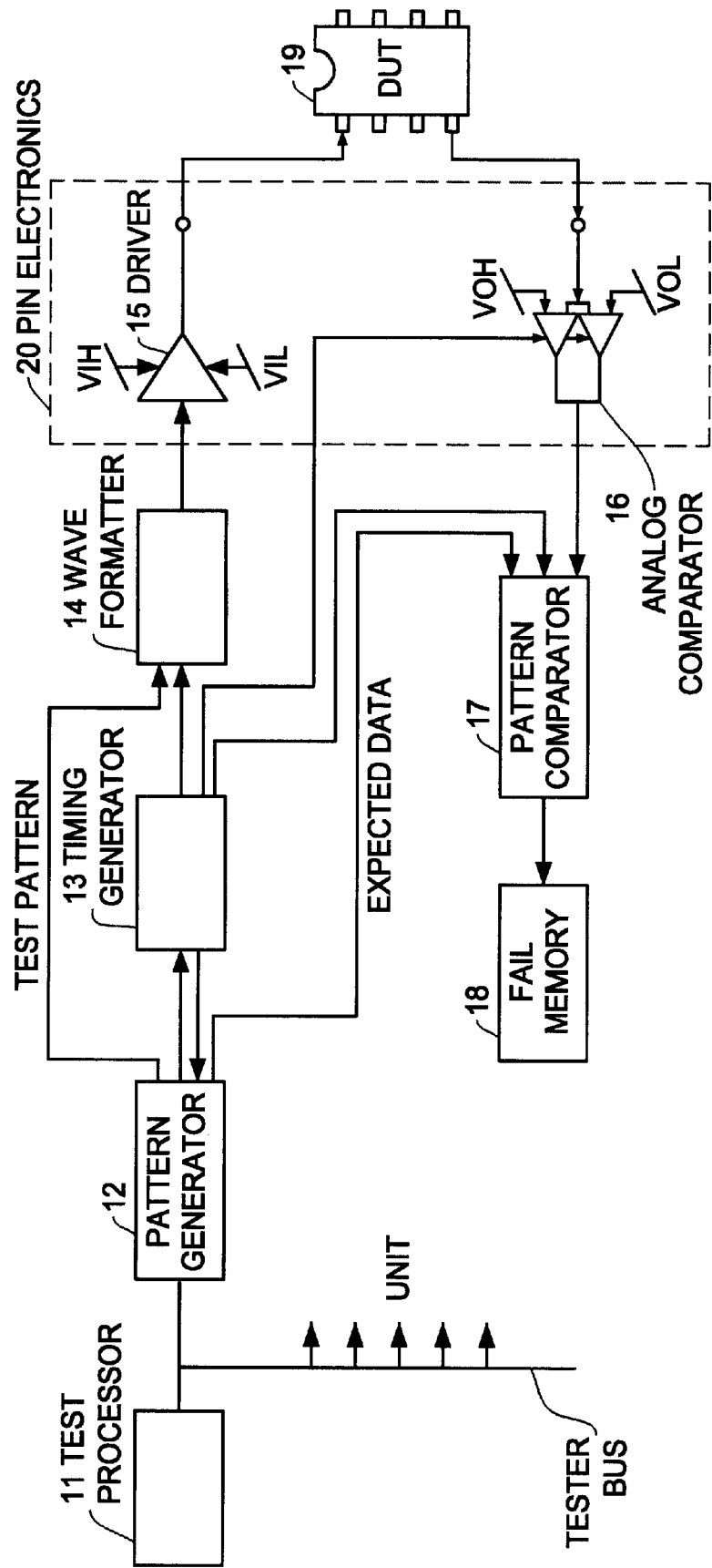
FIG. 1 is a block diagram showing a basic configuration of a semiconductor test system (LSI tester) in the conventional technology.
Figure 2:
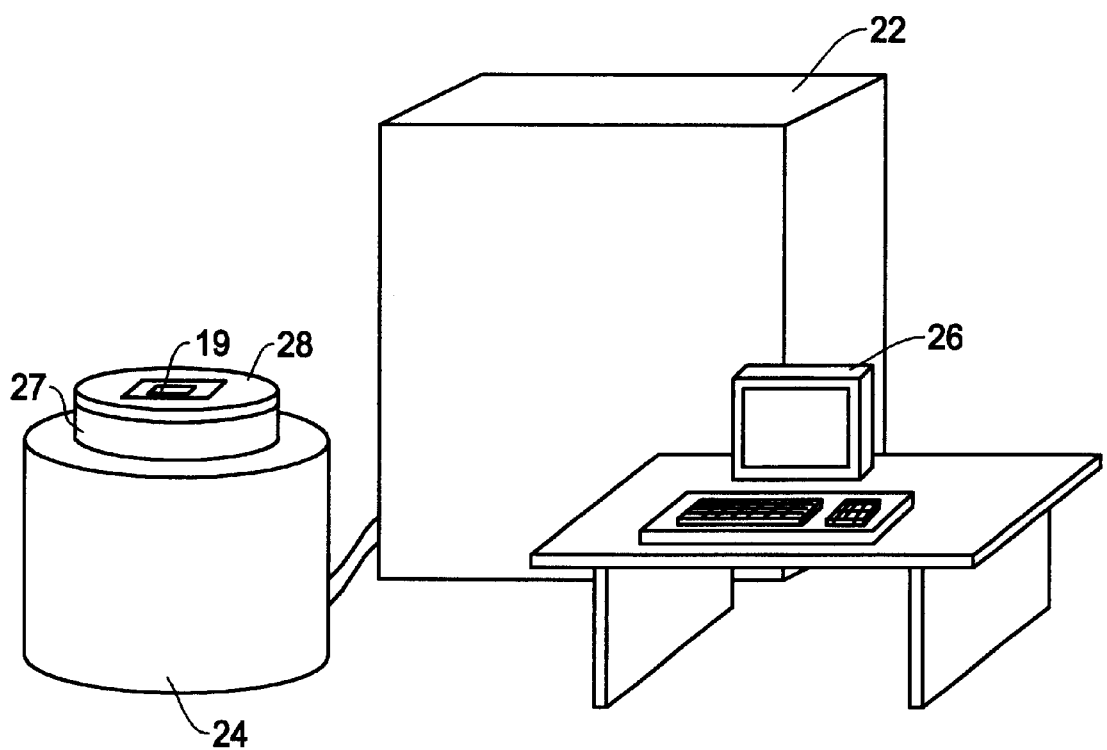
FIG. 2 is a schematic diagram showing an example of outward appearance of a semiconductor test system in the conventional technology.
Figure 3:
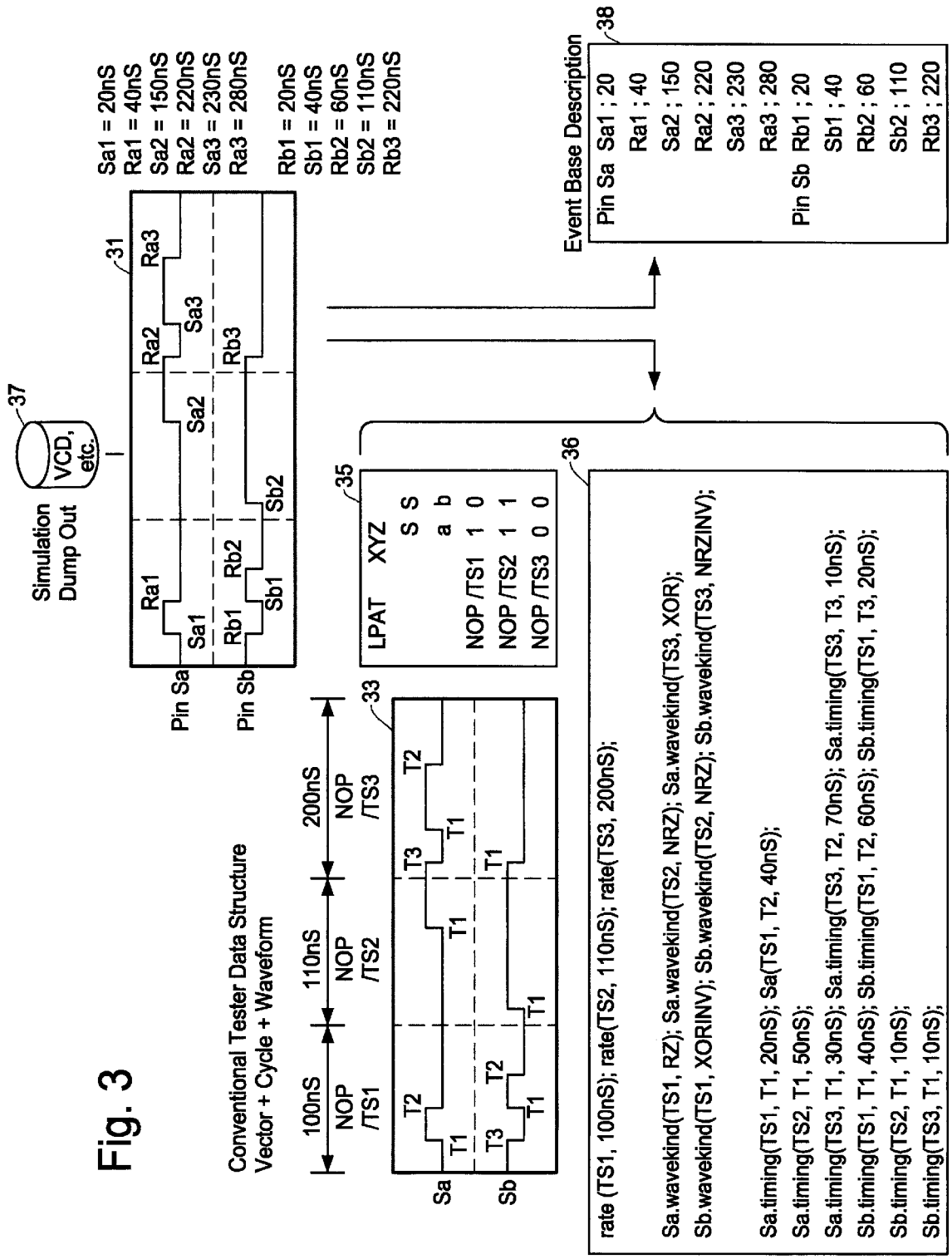
FIG. 3 is a diagram for comparing an example of descriptions for producing a cycle based test pattern in the conventional semiconductor test system with an example of descriptions for producing an event based test pattern in the semiconductor test system of the present invention.
Figure 4:
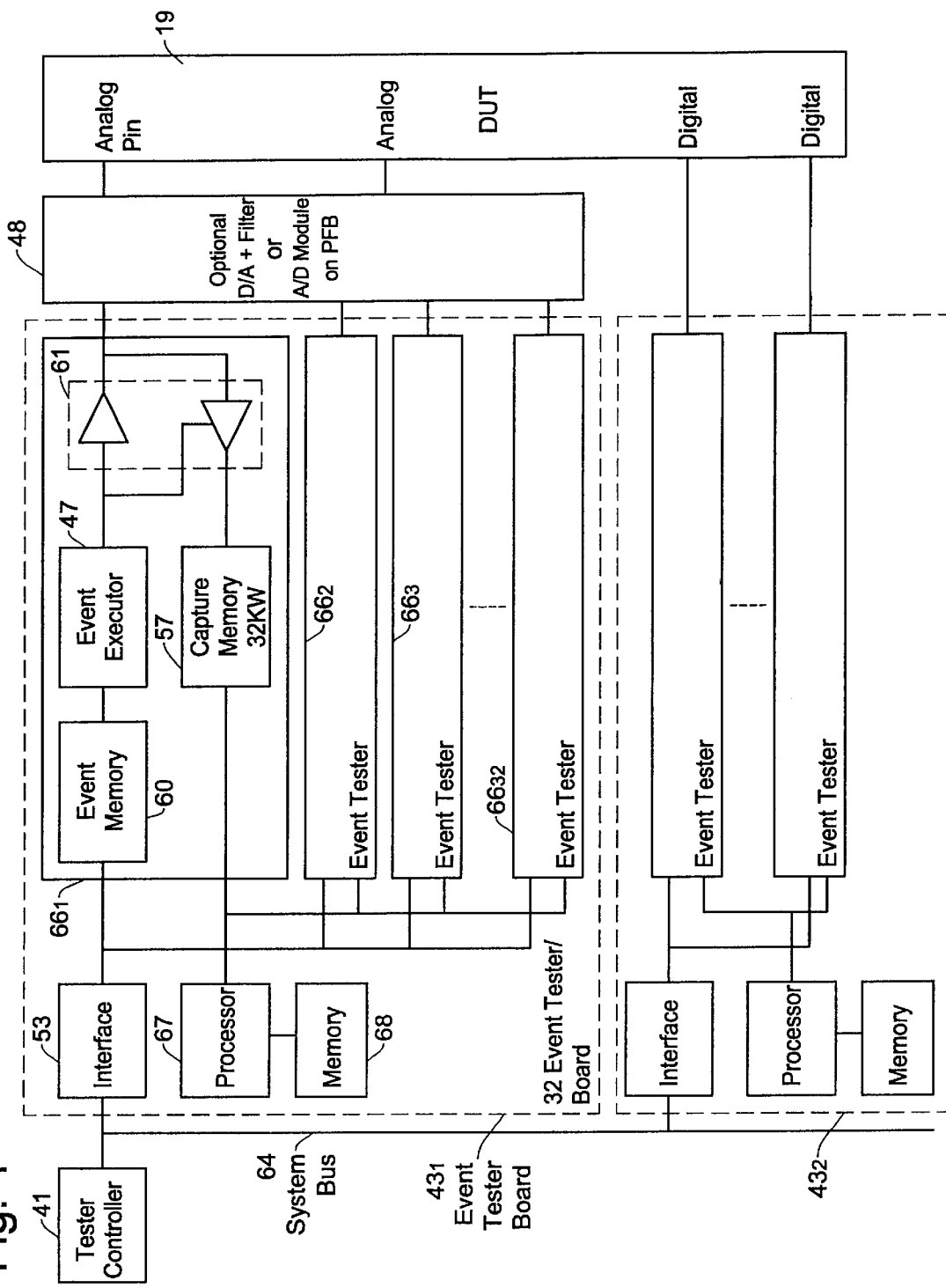
FIG. 4 is a block diagram showing an example of test system configuration for testing admixed signal IC (mixed signal integrated circuit) by a semiconductor test system of the present invention.

The embodiment of the present invention is explained with reference to FIGS. 4–10. FIG. 4 is a block diagram showing a basic structure of the semiconductor test system of the, present invention for testing an analog/digital mixed signal integrated circuit (mixed signal IC). In the semiconductor test system of the present invention, a test head (tester main frame) is so configured that one or more modular testers (hereinafter "tester module") are selectively installed therein. The tester modules to be installed can be a plurality of same tester modules depending on the number of tester pins desired or a combination of different tester modules such as a high speed module HSM and a low speed module LSM.

As will be explained with reference to FIGS. 6 and 7 later, each tester module is provided with a plurality of event tester boards 43, for example, eight (8) tester boards. Further, each event tester board includes a plurality of event testers 66 corresponding to a plurality of tester pins, such as 32 event tester for 32 tester pins. Therefore, in the example of FIG. 4, an event tester board $43_1$ deals with an analog part of the device test while other event tester boards 43 cover a digital part of the device test.

In the test system of FIG. 4, the plurality of event tester boards 43 are controlled by a tester controller 41, which is a host computer of the test system, through a system bus 64. As noted above, for example, eight event tester boards 43 may be installed in one tester module. Although not shown in FIG. 4, typically, a test system of the present invention is configured by two or more such tester modules as shown in FIG. 6.

In the test system of FIG. 4, the event tester board 43 applies a test pattern (test signal) to a device under test 19, and examines a response signal from the device under test resultant from the test pattern. For testing the analog function of the device under test, an optional circuit 48 may be provided in the test system. Such an optional circuit 48 includes, for example, a DA converter, an AD converter and a filter.

Each event tester board 43 includes event testers $66_1$–$66_{32}$ for 32 channels for example, an interface 53, a processor 67 and a memory 68. Each event tester 66 corresponds to a tester pin, and has the same inner structure within the same tester board. In this example, the event tester 66 includes an event memory 60, an event execution unit 47, a driver/comparator 61 and a test result memory 57.

The event memory 60 stores event data for producing a test pattern. The event execution unit 47 produces the test pattern based on the event data from the event memory 60. The test pattern is supplied to the device under test through the driver/comparator 61. In the case where an input pin of the device under test is an analog input, the optional circuit 48 noted above converts the test pattern to an analog signal by the DA converter therein. Thus, the analog test signal is applied to the device under test. An output signal of the device under test is compared with an expected signal by the driver/comparator 61, the result of which is stored in the test result memory 57. In the case where an output signal from the device under test is an analog signal, if necessary, such an analog signal is converted to a digital signal by the AD converter in the optional circuit 48.

Figure 5:
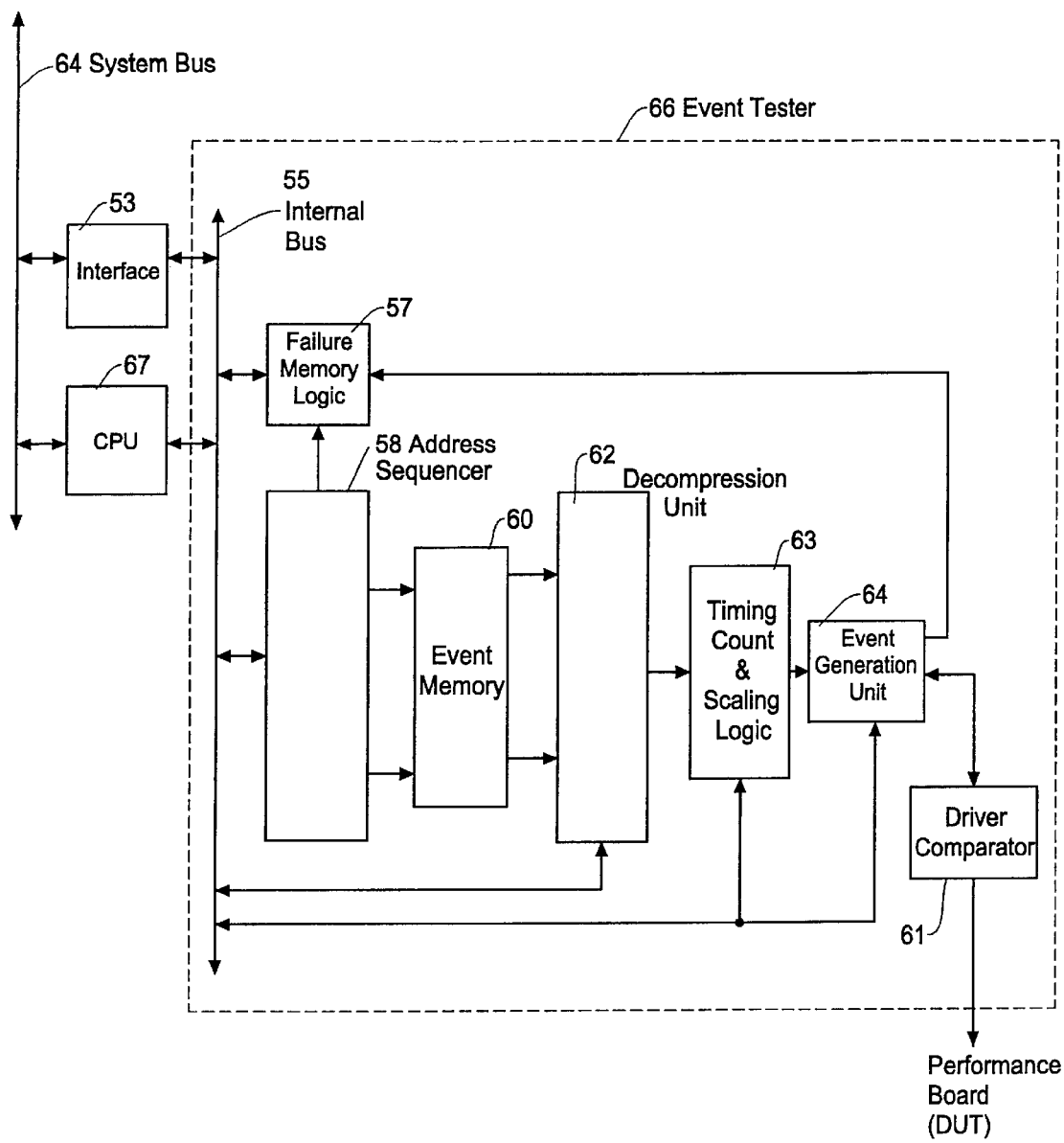
FIG. 5 is a block diagram showing an example of circuit configuration in an event tester provided in an event tester board which is incorporated in a tester module in accordance with the present invention.

FIG. 5 is a block diagram showing an example of configuration in the event tester 66 in the event tester board 43 in more detail. The further detailed description regarding the event based test system is given in the above U.S. patent application as well as U.S. patent application Ser. No. 09/259,401 owned by the same assignee of this invention. In FIG. 5, the blocks identical to that of FIG. 4 are denoted by the same reference labels.

The interface 53 and the processor 67 are connected to the tester processor (host computer) 41 through the system bus 64. The interface 53 is used, for example, for transferring data from the tester controller 41 to a register (not shown) in the event tester board to assign the event testers to the input/output pins of the device under test. For example, when the host computer sends a group assigning address to the system bus, the interface 53 interprets the group assigning address and allows the data from the host computer to be stored in the register in the specified event tester board.

The processor 67 is provided, for example, in each event tester board, and controls the operations in the event tester board including generation of events (test patterns), evaluation of output signals from the device under test, and acquisition of failure data. The processor 67 can be provided at each tester board or every several tester boards. Further, the processor 67 may not always necessary be provided in the event tester board, but the same control functions can be made directly by the tester controller 41 to the event tester boards.

An address controller 58 is, for example, in the most simple case, a program counter. The address controller 58 controls the address supplied to the failure data memory 57 and the event memory 60. The event timing data is transferred to the event memory 60 from the host computer as a test program and stored therein.

The event memory 60 stores the event timing data as noted above which defines timing of each of the events (change points from "1" to "0" and from "0" to "1"). For example, the event timing data is stored as two types of data, one of which shows integer multiples of a reference clock cycle while the other shows fractions of the reference clock cycle. Preferably, the event timing data is compressed before being stored in the event memory 60.

In the example of FIG. 5, the event execution unit 47 in FIG. 4 is configured with a decompression unit 62, a timing count/scaling logic 63, and an event generator 64. The decompression unit 62 decompresses (reproduces) the compressed timing data from the event memory 60. The timing count/scaling logic 63 produces time length data of each event by summing or modifying the event timing data. The time length data expresses the timing of each event by a time length (delay time) from a predetermined reference point.

The event generator 64 produces a test pattern based on the time length data and provides the test pattern to the device under test 19 through the driver/comparator 61. Thus, a particular pin of the device under test 19 is tested by evaluating the response output therefrom. The driver/comparator 61 is mainly formed with, as shown in FIG. 4, a driver which drives the test pattern to be applied to the particular device pin and a comparator which determines a voltage level of an output signal of a device pin resultant from the test pattern and compares the output signal with the expected logic data.

In the event tester summarized above, the input signal applied to the device under test and the expected signal compared with the output signal of the device under test are produced by the data in the event based format. In the event based format, the information of change points on the input signal and expected signal is formed of action information (set and/or reset) and time information (time length from a specified point).

As noted above, in the conventional semiconductor test system, the cycle based method has been used, which requires memory capacity smaller than that required in the event based architecture. In the cycle based test system, the time information of the input signal and expected signal is formed of cycle information (rate signal) and delay time information. The action information of the input signal and expected signal is formed of waveform mode data and pattern data. In this arrangement, the delay time information can be defined only by the limited number of data. Further, to generate the pattern data with flexibility, the test program must includes many loops and/or subroutines therein. Therefore, the conventional test system requires complicated structures and operational procedures.

In the event based test system, such complicated structures and operational procedures of the conventional cycle based test system are unnecessary, thereby easily increasing the number of test pins and/or incorporating the test pins of different performances in the same test system. Although the event based test system requires a memory of large capacity, such an increase in the memory capacity is not a major problem since the increase in the memory density and the decrease in the memory cost are rapidly and continuously realized today.

As in the foregoing, in the event based test system, each of the test pins or each group of test pins can independently perform a test operation from the other. Consequently, in the case where a plurality of different kinds of test have to be performed, such as in testing the mixed signal device under test which includes an analog signal and a digital signal, such different kinds of test can be conducted in parallel at the same time. Further, start and end timings of such different kinds of test can be independently established.

Figure 6:
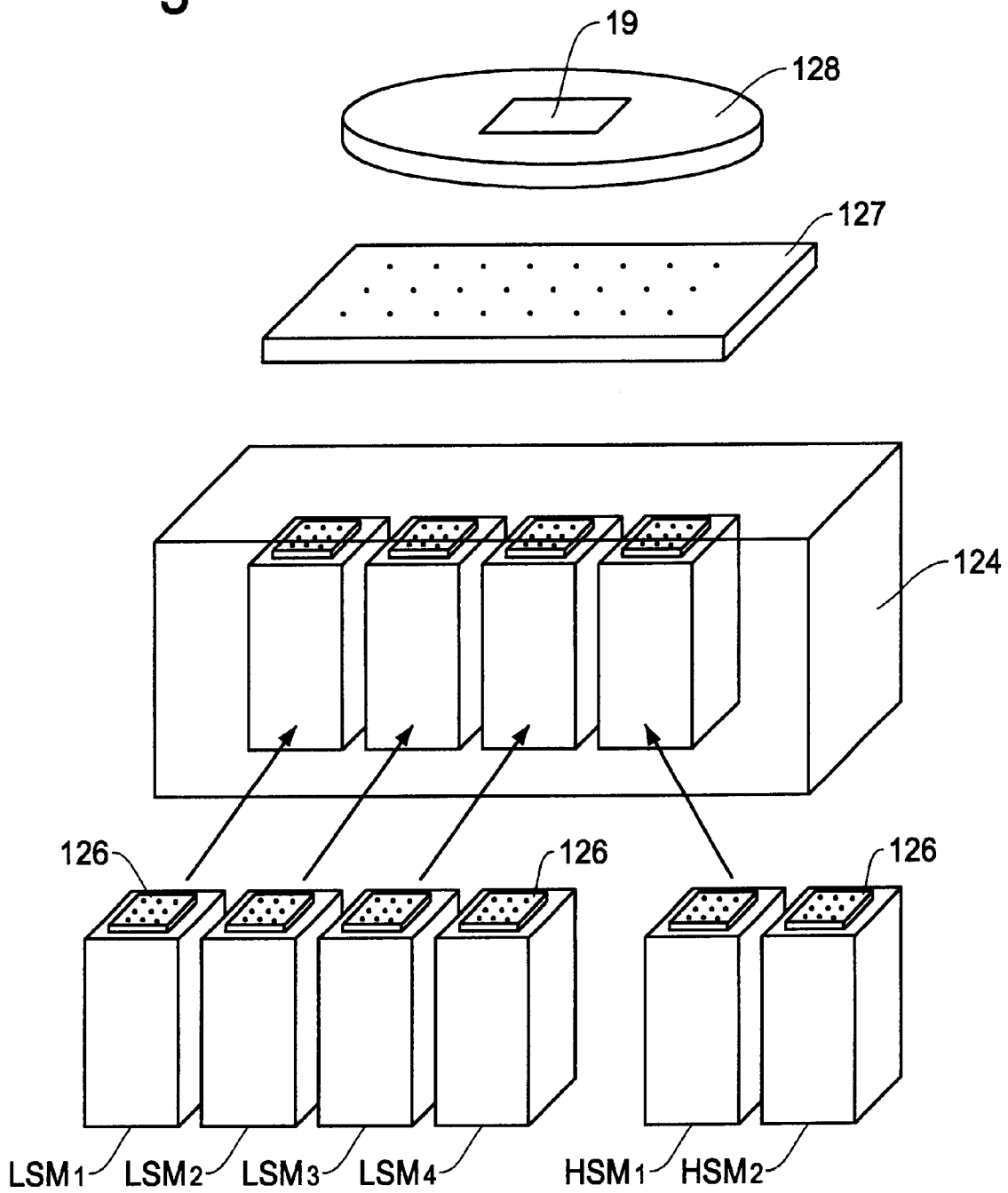
FIG. 6 is a schematic diagram for establishing a semiconductor test system having test pins grouped into different performances by incorporating a plurality of tester modules of the present invention.
Figure 7:
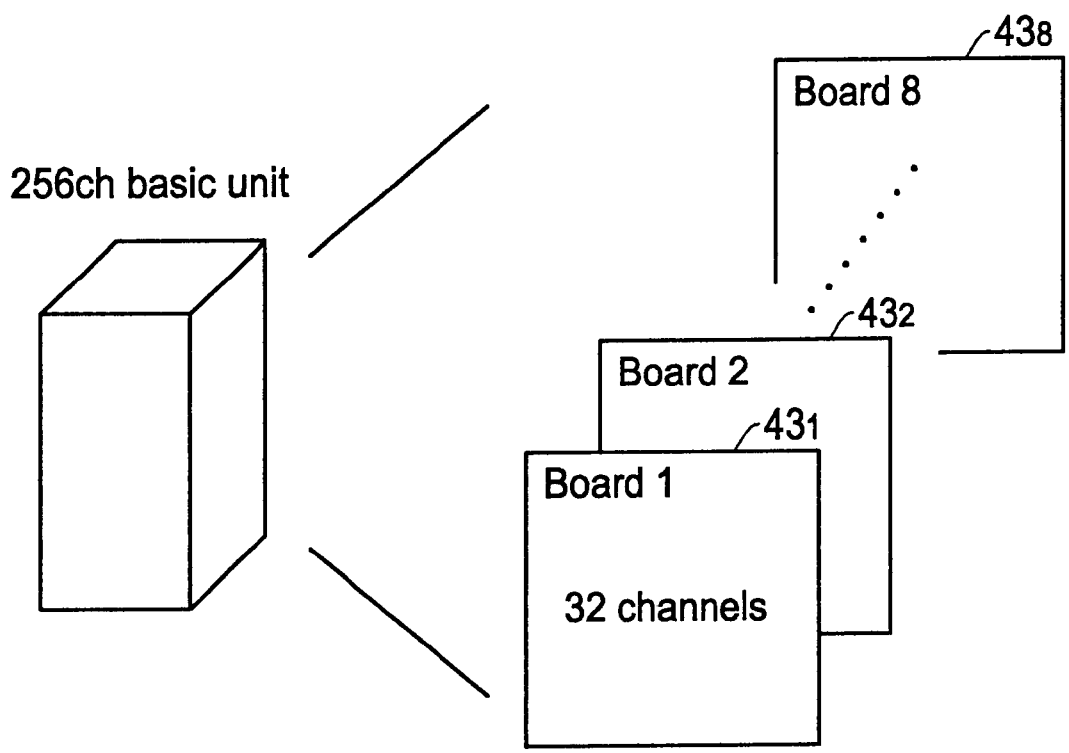
FIG. 7 is a block diagram showing an example of tester module which is comprised of a plurality of event tester boards to be used in the semiconductor test system of the present invention.

FIG. 6 is a schematic diagram for establishing a semiconductor test system having test pins grouped into different performances by incorporating a plurality of tester modules of the present invention.

A test head 124 is provided with a plurality of tester modules depending on, for example, the number of pins of a test fixture 127, a type of the device to be tested, and the number of pins of the device to be tested. As will be described later, an interface (connection) specification between the test fixture and the test module is standardized so that any tester modules can be installed in any positions in the test head.

The test fixture 127 includes a large number of elastic connectors such as pogo-pins to electrically and mechanically connect the tester modules and a performance board 128. The device under test 19 is inserted in a test socket on the performance board 128, thereby establishing an electrical communication with the semiconductor test system. The optional circuit 48 shown in FIG. 4 to be used in analog testing can be formed on the performance board 128 depending on the specification of the device to be tested.

Each of the tester module has a predetermined number of pin groups. For example, one high speed module HSM installs printed circuit boards corresponding to 128 test pins (test channels) while one low speed module LSM installs printed circuit boards corresponding to 256 test pins. These numbers are disclosed only for an exemplary purpose, and various other numbers of test pins are also possible. In the example of FIG. 7, the tester module is configured by 256 channels as a basic unit in which eight (8) event tester boards 43 are installed. Each event tester board includes, for example, 32 event testers (test channels).

As noted above, each board in the tester module has event testers each of which generates and applies test patterns to the corresponding pin of the device under test through the performance board 128. Output signals of the device under test 19 responsive to the test pattern are transmitted to the event tester board in the tester module through the performance board 128 and are compared with the expected signals to determine the pass/fail of the device under test.

Each tester module is provided with an interface (connector) 126. The connector 126 is so arranged to fit to the standard specification of the test fixture 127. For example, in the standard specification of the test fixture 127, a structure of connector pins, impedance of the pins, distance between the pins (pin pitch), and relative positions of the pins are specified for the intended test head. By using the interface (connector) 126 which matches the standard specification on all of the tester modules, test systems of various combinations of the tester modules can be freely established.

Because of the configuration of the present invention, a test system of optimum cost/performance which matches the device under test can be established. Further, improvement of the performance of the test system can be achieved by replacing one or more test modules, thus, an overall life time of the test system can be increased. Moreover, the test system of the present invention can accommodate a plurality of test modules whose performances are different from the other, and thus, the desired performance of the test system can be achieve directly by the corresponding test module. Therefore, the performance of the test system can be easily and directly improved.

FIG. 8 is a block diagram showing a basic concept for conducting different types of test in parallel for a mixed signal device 19 having analog and digital functions by the semiconductor test system of the present invention. In this example, the mixed signal device 19 includes an AD converter circuit, a logic circuit, and a DA converter circuit. The semiconductor test system of the present invention can perform test for each group of specified number of tester pins independently from the other group as noted above. Therefore, by assigning the groups of tester pins to these circuits in the mixed signal device, these circuits can be tested in parallel at the same time.

FIG. 9A is a schematic diagram showing a test process for testing the mixed signal device by the conventional semiconductor test system and FIG. 9B is a schematic diagram showing a test process for testing the mixed signal device by the semiconductor test system of the present invention. When testing the mixed signal IC having analog and digital circuits such as shown in FIG. 8 by the conventional semiconductor test system, the test must proceed in a series fashion such as completing one test and moving to the next test. Therefore, the overall time required for completing the test is the sum of times of all of the tests as shown in FIG. 9A.

In contrast, when testing the mixed signal IC shown in FIG. 8 by the semiconductor test system of the present invention, the AD converter circuit, logic circuit and DA converter circuit can be tested in parallel at the same time as shown in FIG. 9B. Thus, the present invention can dramatically reduce the overall test time. Since it is a common practice to evaluate the test result of the AD converter circuit or DA converter circuit by predetermined formulas, a computation time after each of the AD and DA circuit test is provided in FIGS. 9A and 9B.

Figure 10:
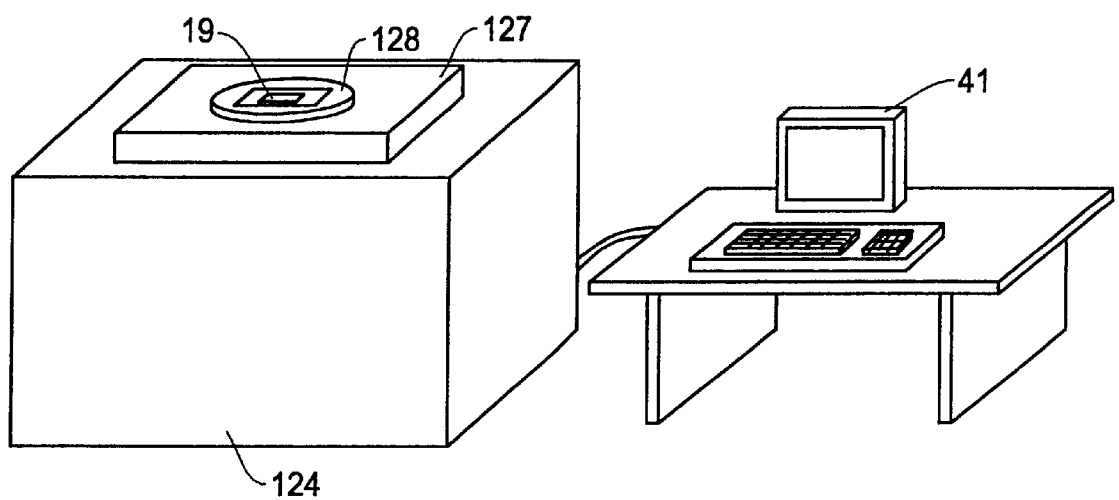
FIG. 10 is a schematic diagram showing an example of outward appearance of the semiconductor test system of the present invention.

An example of outer appearance of the semiconductor test system of the present invention is shown in the schematic diagram of FIG. 10. In FIG. 10, a host computer (main system computer) 41 is, for example, a work station having a graphic user interface (GUI). The host computer functions as a user interface as well as a controller to control an overall operation of the test system. The host computer 41 and the inner hardware of the test system are connected through the system bus 64 (FIGS. 4 and 5).

The event based test system of the present invention does not need the pattern generator and the timing generator used in the conventional semiconductor test system configured by the cycle based concept. Therefore, it is possible to substantially decrease the physical size of the overall test system by installing all of the modular event testers in the test head (or tester main frame) 124.

As has been foregoing, in the event based semiconductor test system of the present invention, each test pin can operate independently from the other test pins. Thus, by assigning groups of test pins to different devices or blocks under test, two or more different devices or blocks can be tested at the same time. Therefore, according to the semiconductor test system of the present invention, an analog circuit and a digital circuit in a mixed signal device can be tested in parallel at the same time.

As noted above, in the semiconductor test system of the present invention, the tester module (tester board) is configured by event based architecture where all the information required for executing the test is prepared in the event based format. Therefore, the rate signal showing the start timing of each test cycle or the pattern generator which operates in synchronism with the rate signal used in the conventional technology are no longer necessary. Because it is not necessary to include the rate signal or pattern generator, each test pin in the event based test system can operate independently from the other test pins. Therefore, different types of test, such as analog circuit test and digital circuit test can be performed at the same time.

Since the semiconductor test system of the present invention has a modular structure, a desired test system can be formed freely depending on the kind of devices to be tested and the purpose of the test. Further, the hardware of the event based test system can be dramatically reduced while the software for the test system can be dramatically simplified. Accordingly, the tester modules of different capabilities and performances can be installed together in the same test system. Furthermore, as shown in FIG. 6, an overall physical size of the event based test system can be considerably reduced, resulting in further cost reduction, floor space reduction and associated cost savings.

Further in the semiconductor test system of the present invention, the logic simulation data in the design stage of the device in the electronic design automation (EDA) environment can be directly used to produce the test pattern to test the device in the evaluation stage. Thus, a turnaround time between the design of the device and the evaluation of the device can be substantially decreased, thereby further decreasing the test cost while increasing the test efficiency.

What is claimed is:

1. A semiconductor test system for testing a mixed signal integrated circuit, comprising:

two or more tester modules whose performances are different from one another where each tester module includes at least one event tester which produces a test pattern based on test data described in an event format;

a test head to accommodate the two or more tester modules having different performances;

means provided on the test head for electrically connecting the tester modules and a device under test;

an optional circuit corresponding to the device under test when the device under test is a mixed signal integrated circuit having an analog function block and a digital function block, and a host computer for controlling an overall operation of the test system by communicating with the tester modules through a tester bus;

whereby the analog function block and the digital function block of the mixed signal integrated circuit being tested in parallel at the same time, and wherein the event data defines events as any changes in the test pattern generated by the event tester at timings relative to one fixed reference point.

2. A semiconductor test system for testing a mixed signal integrated circuit as defined in claim 1, wherein one type of the performances of the tester module is a high speed and high timing resolution while another type of performance is a low speed and low timing resolution.

3. A semiconductor test system for testing a mixed signal integrated circuit as defined in claim 1, wherein interface specification for connecting the tester modules and the means for electrically connecting the tester modules and the device under test is standardized.

4. A semiconductor test system for testing a mixed signal integrated circuit as defined in claim 1, wherein the means for electrically connecting the tester modules and the device under test is comprised of a performance board having a test socket for mounting the device under test thereon and signal patterns connected to the test socket, and a test fixture having a connection mechanism for electrically connecting between the performance board and the tester modules, thereby establishing electrical communication between the device under test and the tester modules.

5. A semiconductor test system for testing a mixed signal integrated circuit as defined in claim 1, wherein a number of tester pins for each tester module is variable.

6. A semiconductor test system for testing a mixed signal integrated circuit as defined in claim 1, wherein a number of tester pins is variably assigned to the tester module, and such assignment of test pins and modification thereof are regulated by address data from the host computer.

7. A semiconductor test system for testing a mixed signal integrated circuit as defined in claim 1, wherein each of the tester modules includes a plurality of event tester boards where each of the event tester boards includes a plurality of event testers which are assigned to a predetermined number of test pins.

8. A semiconductor test system for testing a mixed signal integrated circuit as defined in claim 7, wherein each of the tester modules corresponds to one of the event tester boards.

9. A semiconductor test system for testing a mixed signal integrated circuit as defined in claim 7, wherein each of the tester modules includes a plurality of event tester boards wherein each of the event tester boards includes an inner controller where the inner controller controls, in response to instructions from the host computer, to generate a test pattern, supply the test pattern to the device under test, and to evaluate an output signal of the device under test.

10. A semiconductor test system for testing a mixed signal integrated circuit as defined in claim 1, wherein each of the tester modules includes an inner controller where the inner controller controls, in response to instructions from the host computer, to generate a test pattern from the tester module, supply the test pattern to the device under test, and to evaluate an output signal of the device under test.

11. A semiconductor test system for testing a mixed signal integrated circuit as defined in claim 1, wherein each of the tester modules includes a plurality of event tester boards each having a plurality of event tester where each of the event testers is assigned to one test pin, wherein each event tester is comprised of:

a controller which controls, in response to instructions from the host computer, an operation of the event tester;

an event memory for storing timing data for each event;

an address sequencer for providing, under the control of the controller, address data to the event memory;

means for producing the test pattern based on the timing data from the event memory; and a driver/comparator for transferring the test pattern to a corresponding pin of the device under test and receiving the output signal from the device under test.

* * * * *